US007746093B2

(12) United States Patent
Cha

(10) Patent No.: US 7,746,093 B2
(45) Date of Patent: Jun. 29, 2010

(54) DRIVING CHIP PACKAGE, DISPLAY DEVICE INCLUDING THE SAME, AND METHOD OF TESTING DRIVING CHIP PACKAGE

(75) Inventor: Ki-seok Cha, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 408 days.

(21) Appl. No.: 11/586,206

(22) Filed: Oct. 25, 2006

(65) Prior Publication Data

US 2007/0182440 A1 Aug. 9, 2007

(30) Foreign Application Priority Data

Feb. 3, 2006 (KR) ...................... 10-2006-0010693

(51) Int. Cl.
*G01R 31/28* (2006.01)
*G01R 31/08* (2006.01)

(52) U.S. Cl. ........................ 324/770; 324/527; 324/691

(58) Field of Classification Search ................. 324/770, 324/158.1, 527, 537, 538, 691; 340/635, 340/652, 653
See application file for complete search history.

(56) References Cited

U.S. PATENT DOCUMENTS 4,730,156 A * 3/1988 Matsuda ..................... 340/653
6,262,696 B1 * 7/2001 Seraphim et al. ............. 345/1.3
6,420,883 B1 * 7/2002 Watanabe et al. ........... 324/691
6,509,949 B1 * 1/2003 Lu et al. ...................... 349/187
6,794,725 B2 * 9/2004 Lemmi et al. ............... 257/448
7,345,501 B2 * 3/2008 Hasegawa et al. ........... 324/770

* cited by examiner

*Primary Examiner*—Vinh P Nguyen
(74) *Attorney, Agent, or Firm*—F. Chau & Associates, LLC

(57) ABSTRACT

A driving chip package, a display device including the same, and a method of testing the driving chip package are disclosed. Any contact failure between the driving chip package and the display substrate can be easily detected, thus reducing the quality management cost and preventing additional failures and increasing the manufacturing yield. The driving chip package includes a base film made of an insulating material, a plurality of interconnection lines formed (e.g., patterned) on the base film (that conduct externally processed driving signals to driving chip and that conduct the driving signals processed in and output by the driving chip), and at least one test interconnection line (e.g., a test signal input interconnection line or a test signal output interconnection line) formed parallel to the interconnection lines on the base film. A test signal input interconnection line and a corresponding test signal output interconnection line are electrically connected through a link on the display substrate.

15 Claims, 4 Drawing Sheets

DRIVING CHIP PACKAGE, DISPLAY DEVICE INCLUDING THE SAME, AND METHOD OF TESTING DRIVING CHIP PACKAGE

CROSS-REFERENCE TO RELATED APPLICATION

This application claims priority, under 35 U.S.C. § 119, of Korean Patent Application No. 10-2006-0010693 filed on Feb. 3, 2006 in the Korean Intellectual Property Office, the disclosure of which is incorporated herein by reference in its entirety.

BACKGROUND OF THE INVENTION

1. Field of the Invention

The present invention relates to a driving chip package, a display device including the same, and a method of testing the driving chip package, and more particularly to a driving chip package, a display device including the driving chip package, and a method of testing the driving chip package to easily detect a contact failure of the driving chip package.

2. Description of the Related Art

Liquid crystal display devices have notable advantages over other display technologies, such as a small size, light weight, low power consumption and low driving voltages, and have become the mainstream of display devices.

A liquid crystal display device typically has a liquid crystal panel assembly and a backlight assembly that supplies the liquid crystal panel assembly with light. Here, the liquid crystal panel assembly includes a liquid crystal panel and a driving assembly that provides the liquid crystal panel with various driving and control signals, and a printed circuit board of the driving assembly is connected to the liquid crystal panel through a driving chip package.

As the size of liquid crystal displays increases, the size and weight of a printed circuit boards (PCBs) mounted thereon inevitably increases, which adversely affects the performance of a driving chip package. A contact failure can occur in a contact portion between the driving chip package and the substrate of the liquid crystal panel, or between the driving chip package and the PCB. Such a contact failure is not easy to detect, causing a reduction in the yield or an increase in the quality management cost. Therefore, a method of easily detecting a contact failure is needed.

SUMMARY OF THE INVENTION

An aspect of the invention provides a display device having a plurality of driving chip packages each including at least one test interconnection line (e.g., a test signal input interconnection line or a test signal output interconnection line) formed parallel to a plurality of (data) interconnection lines formed on the base film of the driving chip package. A test signal input interconnection line and a corresponding test signal output interconnection line are electrically connected to each other through a conductive link formed on the substrate of the display device. By transmitting and detecting a test signal though a corresponding pair of test interconnection lines (and through a conductive link formed on the substrate of the display device) a contact failure can be easily detected.

According to an aspect of the present invention, there is provided a driving chip package including a base film made of an insulating material; a plurality of interconnection lines formed (e.g., patterned) on the base film, the interconnection lines including input interconnection lines that provide externally processed driving signals to a driving chip and output interconnection lines that output the driving signals processed in the driving chip; and at least one test interconnection line formed (parallel to the interconnection lines) on the base film, the at least one test interconnection line including at least one of a test signal input interconnection line and a test signal output interconnection line.

According to another aspect of the present invention, there is provided a display device including a substrate of a display panel (that displays an image); a printed circuit board (PCB) (that generates driving signals and control signals that drive and control the display panel); and a plurality of driving chip packages (that electrically connect the display panel and the PCB). Each of the driving chip packages has a base film made of an insulating material; a plurality of interconnection lines formed (e.g., patterned) on the base film, the interconnection lines including input interconnection lines (that provide externally processed driving signals to driving chip) and output interconnection lines (that output the driving signals processed in the driving chip); and at least one (e.g., two) test interconnection lines formed (e.g., patterned) along side of (parallel to) the plurality of interconnection lines on the base film. The at least one test interconnection lines include at least one of test signal input interconnection line and a test signal output interconnection line.

According to still another aspect of the present invention, there is provided a method of testing a driving chip package, the method comprising: providing a display device having a substrate (e.g., part of the display panel), providing a printed circuit board (PCB) (that generates driving signals and control signals that drive and control the display panel), providing a plurality of driving chip packages (that) electrically connect the display panel and the PCB. Each of the driving chip packages includes at least one (e.g., two) test interconnection line (e.g., at least one of a test signal input interconnection line and a test signal output interconnection line). The method further comprises providing a predetermined test signal (e.g., received from an external device) to at least one test signal input interconnection line; conducting the predetermined test signal through at least one test signal output interconnection line electrically connected to the test signal input interconnection line through short-circuited interconnection lines formed on the display panel; and determining whether the test signal is detected (test signal output interconnection line). A predetermined control signal, (e.g., a power OFF signal) may be generated if the test signal is not detected.

BRIEF DESCRIPTION OF THE DRAWINGS

The above and other features of the present invention will become apparent by describing in detail exemplary embodiments thereof with reference to the attached drawings in which.

DETAILED DESCRIPTION OF THE EXEMPLARY EMBODIMENTS

Figure 1:
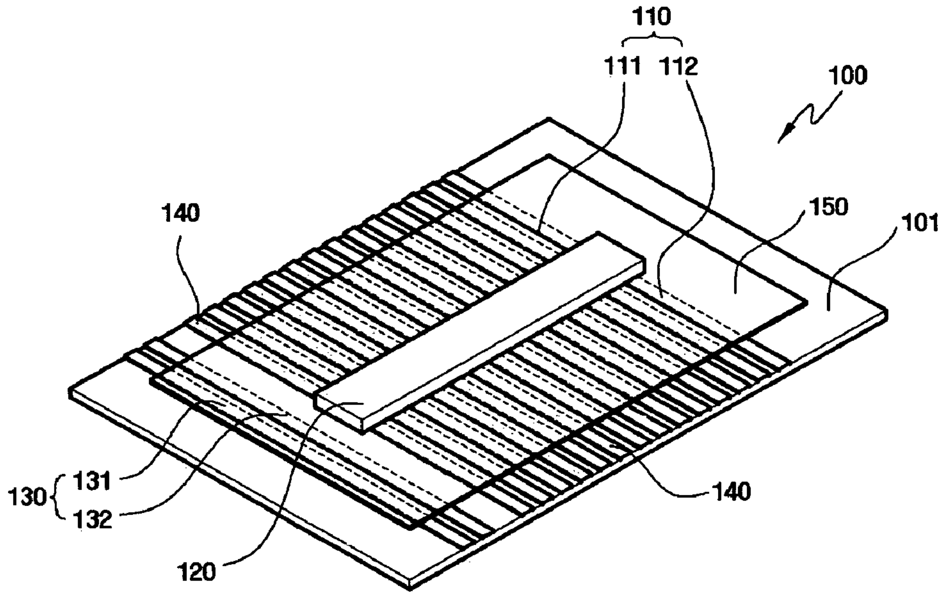
FIG. 1 is a perspective view of a data driving chip package according to a first embodiment of the present invention.

FIG. 1 is a perspective view of a data driving chip package according to a first embodiment of the present invention.

Referring to FIG. 1, a data driving chip package 100 includes a base film 101 that is made of a soft (flexible) material, an interconnection lines 110 that is formed on a surface of the base film 101 and includes driving signal input interconnection lines 111 and driving signal output interconnection lines 112, a driving chip 120 that electrically contacts the interconnection lines 110 (e.g., electrically connected to each of the driving signal input interconnection lines 111 and each of the driving signal output interconnection lines 112), and a test interconnection lines 130 (including test signal input interconnection line 131 and test signal output interconnection line 132) that is formed adjacent to and along the interconnection lines 110.

The driving chip 120 is mounted on inner leads (not shown) formed inside a chip mounting area (not shown, under the driving chip 120) on the base film 101 and the inner leads are connected to outer leads 140 formed at both terminal portions of the base film 101 through the interconnection lines 110. The driving chip 120 can be connected to an external device through the outer leads 140. The test interconnection lines 130 may be formed between the outer leads 140 at both terminal portions of the base film 101 or at one terminal portion of the base film 101.

The base film 101 is made of a soft (flexible) material having a thickness of, for example, 20-100 μm. The base film 101 may be made of an insulating material such as polyimide resin or polyester resin.

The interconnection lines 110 includes the driving signal input interconnection lines 111 for providing driving signals processed in an external device to the driving chip 120 and the driving signal output interconnection lines 112 for outputting the driving signals processed in the driving chip 120. The interconnection lines 110 is formed to have a thickness in a range of 5-20 μm and is generally made of a metal such as a copper (Cu) foil. Preferably, tin, gold, nickel, or lead is plated onto the surface of the Cu foil interconnection lines 110.

The Cu foil (an example of the material of the interconnection lines 110) may be formed through casting, laminating, or electroplating. Casting involves thermal curing by applying a liquid base film onto a rolled Cu foil. Laminating involves placing a rolled Cu foil onto a base film and performing thermo-compression. Electroplating involves depositing a Cu seed layer onto a base film, putting the base film into an electrolyte solution in which Cu is dissolved, and then applying current to the electrolyte.

The interconnection lines 110 is formed to configure a predetermined circuit by selectively etching the Cu foil through a photo/etching process.

The test interconnection lines 130 includes the test signal input interconnection line 131 for receiving a predetermined test signal from an external device and the test signal output interconnection line 132 for outputting an input test signal. The test interconnection lines 130 is provided adjacent to and along (parallel to) the interconnection lines 110 on the base film 101. In other words, the test interconnection lines 130 is positioned at one side portion of the base film 101 and is formed in parallel with the interconnection lines 110. The test interconnection lines 130 may be formed on the same metal layer as the interconnection lines 110.

The test interconnection lines 130 can detect a contact failure of the data driving chip package 120 attached to a display panel (not shown) and may be bent (flexed) with a printed circuit board (PCB: not shown) when being assembled with a display device. The test interconnection lines 130 may be formed on the base film 101 using a separate metal material after or before the interconnection lines 110 is formed. However, it is preferable that the test interconnection lines 130 and the interconnection lines 110 be made of the same material during the same process for process simplicity. Thus, like the interconnection lines 110, a Cu foil may be used for the test interconnection lines 130. The test interconnection lines 130 may have a wider width than the interconnection lines 110 to withstand external mechanical stress, but preferably, has the same width as the interconnection lines 110.

To protect the interconnection lines 110 and the test interconnection lines 130 formed on the base film 101 from an external shock or a corrosive, it is preferable that the base film 101, except for a portion where the data driving chip 120 is mounted, be covered by an insulating protection layer 150. Solder resist may be used as the insulating protection layer 150.

The driving chip 120 may be mounted in a "flip-chip" manner on the base film 101. The driving chip 120 may be a data driving chip for providing a data driving signal to the display panel (not shown in FIG. 1, see FIG. 3).

Hereinafter, a data driving chip package 200 according to a second embodiment of the present invention will be described with reference to FIG. 2.

Figure 2:
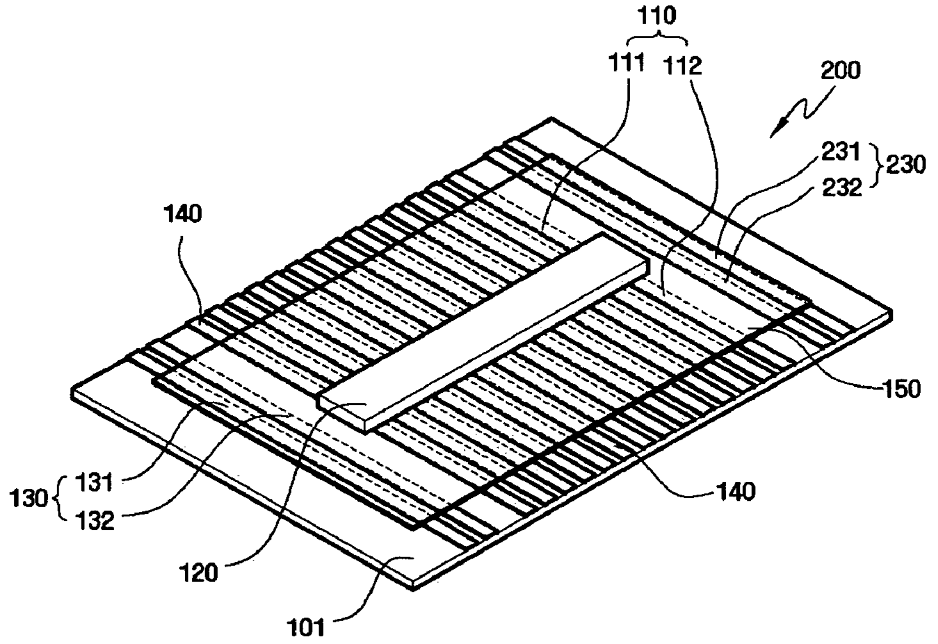
FIG. 2 is a perspective view of a data driving chip package according to a second embodiment of the present invention.

FIG. 2 is a perspective view of a data driving chip package according to a second embodiment of the present invention. For brevity of explanation, the same or corresponding elements will be denoted with the same reference characters in FIG. 1 and therefore the description thereof will not be repeated.

Referring to FIG. 2, the data driving chip package 200 includes the base film 101, the interconnection lines 110 including the driving signal input interconnection lines 111 and the driving signal output interconnection lines 112, the data driving chip 120, the outer leads 140, and first and second test interconnection line patterns 130 and 230. The first test interconnection lines 130 includes first test signal input interconnection lines 131 and first test signal output interconnection lines 132 and the second test interconnection line pattern 230 includes a second test signal input interconnection line 231 and a second test signal output interconnection line 232.

The test interconnection line patterns 130 and 230 are formed at both (opposite) sides of the base film 101. In other words, the first test interconnection lines 130 is formed at one side of the base film 101 adjacent to and along (parallel to) the interconnection lines 110, and the second test interconnection line pattern 230 is formed at the other side of the base film 101 adjacent to and along (parallel to) the interconnection lines 110. Thus, a test signal input from an external device is input to the first and second test signal input interconnection lines 131 and 231 and is output through the first and second test signal output interconnection lines 132 and 232.

Hereinafter, display panel assemblies using the data driving chip packages 100 and 200 will be described with reference to FIGS. 3 and 4.

Figure 3:
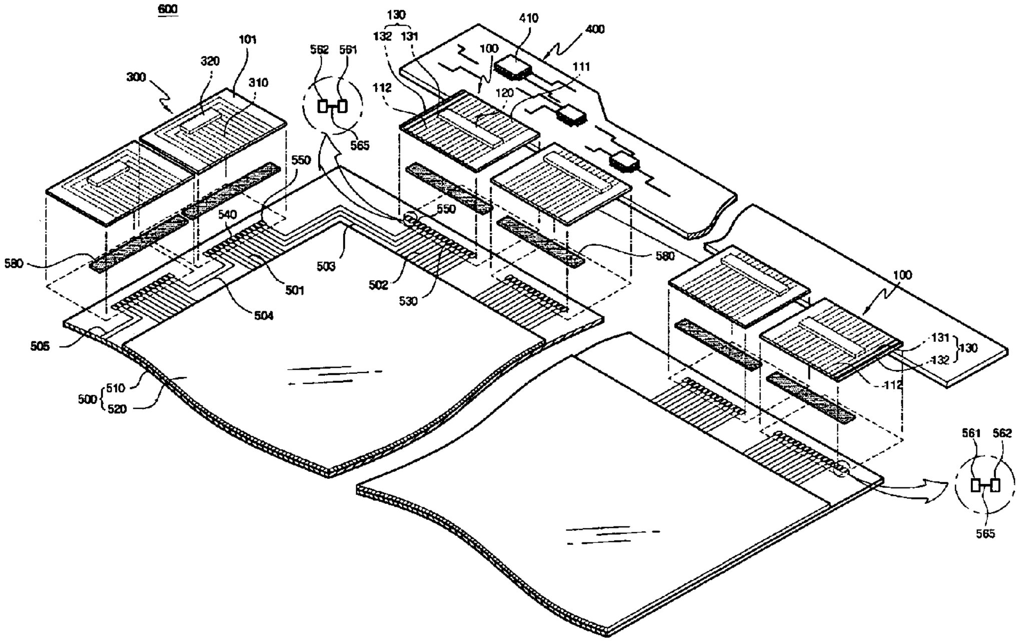
FIG. 3 is a perspective view of portions of display panel assembly using the data driving chip package of FIG. 1.
Figure 4:
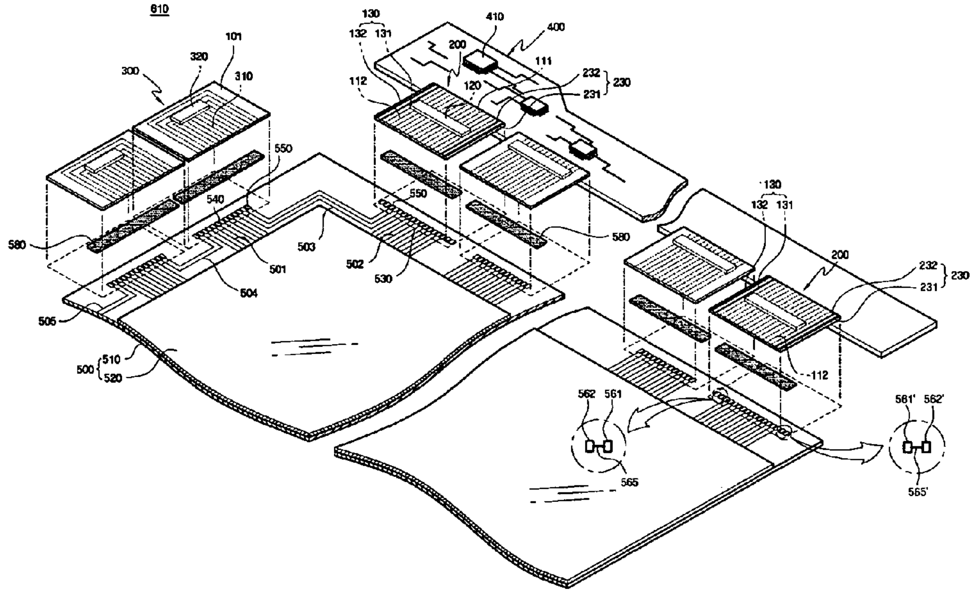
FIG. 4 is a perspective view of portions of display panel assembly using the data driving chip package of FIG. 2.

FIG. 3 is a perspective view of portions of a display panel assembly 600 including the data driving chip package of FIG. 1, and FIG. 4 is a perspective view of portions of a display panel assembly 610 including the data driving chip package of FIG. 2.

Referring first to FIG. 3, the display panel assembly 600 includes a display panel 500, driving chip packages 100 and 300, and a PCB (printed circuit board) 400. Referring to FIG. 4, the display panel assembly 610 includes the display panel 500, driving chip packages 200 and 300, and the PCB (printed circuit board) 400. The driving chip packages include gate driving chip packages 300 and data driving chip packages 100 (200).

The display panel 500 includes a first substrate 510 and a second substrate 520. The second substrate 520 is smaller in area than the first substrate 510 and is deposed to face the first substrate 510. The first substrate 510 includes gate lines 501, data lines 502, thin film transistors (TFTs) (not shown), and pixel electrodes (not shown). The second substrate 520 includes a light blocking pattern (black matrix) (not shown), a color filter pattern (not shown), and a common electrode (not shown). A liquid crystal layer (not shown) is interposed between the first substrate 510 and the second substrate 520.

The gate driving chip packages 300 are connected to the gate lines 501 formed on the first substrate 510, and the data driving chip packages 100 (200) are connected to the data lines 502 formed on the first substrate 510.

The PCB (printed circuit board) 400 has a plurality of driving elements 410 mounted thereon and the driving elements 410 may be semiconductor chips designed using one-chip technology. A gate driving signal and a data driving signal from the PCB 400 can be input to the gate driving chip package 300 and to the data driving chip package 100 (200), respectively. The PCB 400 includes a driving power generating unit (not shown) for generating a driving power of the display panel 500 and a testing unit (not shown, see 400 in FIG. 5A) for testing for a contact failure between the display panel 500 and the data driving chip package 100 (200) or between the PCB 400 and the data driving chip package 100 (200) by providing a predetermined test signal to the test interconnection line patterns 130 and 230 formed on the data driving chip package 100 (200). The operations of the testing unit (not shown) (on the PCB 400) and of the data driving chip package 100 (200) will be described below in greater detail with reference to FIGS. 5A, 5B, and 6 and Table 1.

The gate lines 501 formed on the first substrate 510 have a uniform spacing interval within an effective display (pixel array) region in which an actual image is displayed. But, in a non-effective display region at the periphery of the first substrate 510, the gate lines 501 may be formed in compact groups (groups of gate lines 501) in which they have a smaller spacing interval therebetween so as to be easily connected to the gate driving chip package 300.

Similarly, the data lines 502 formed on the first substrate 510 have a uniform spacing interval within the effective display (pixel array) region, but in the non-effective display region may be formed in groups in which they have a smaller spacing interval therebetween so as to be easily connected to the data driving chip package 100 (200).

A first gate driving signal transmission line 503 is disposed at the edge of the first substrate 510 between the gate driving chip package 300 and the data driving chip package 100 (200) that are nearest to each other. One terminal portion of the first gate driving signal transmission line 503 is extended along (parallel to) the data lines 502 and the other terminal portion of the first gate driving signal transmission line 503 is extended along (parallel to) the gate lines 501.

Other gate driving signal transmission lines separated from the first gate driving signal transmission line 503, (e.g., a second gate driving signal transmission line 504 or a third gate driving signal transmission line 505), are disposed between adjacent groups of gate lines 501 on the first substrate 510.

As described with reference to FIGS. 1 and 2, the test interconnection lines 130 (230) including the test signal input interconnection lines 131 (231) and the test signal output interconnection lines 132 (232) formed adjacent to each other is formed on the data driving chip package 100 (200) along (adjacent to and parallel to) the interconnection lines 110 on the base film 101. Although the test interconnection lines 130 (230) is formed in each of the data driving chip packages 100 (200) which are disposed at the edge of the display panel assembly 600 (610), i.e., at a position applied with mechanical stress due to continuous torque, the test interconnection lines 130 (230) may be formed on the entire surface of the data driving chip package 100 (200).

In addition, the outer leads 140 (which, as mentioned above, are exposed from the insulating protecting layer 150 are formed at both terminal portions of the base film 101) are bonded to the display panel 500 and to the PCB 400. On the display panel 500, data line pads 530 connected to the data lines 502, gate line pads 540 connected to the gate lines 501, transmission line pads 550 connected to the gate driving signal transmission lines 503, 504, and 505, and test signal input pads 561 and 561') and test signal output pads 562 (and 562') corresponding to the test interconnection lines 130 (230) of the data driving chip package 100 (200) are formed. Each of the test signal input pads 561 (and 561') is electrically connected to one of the test signal output pads 562 (and 562') by short-circuited interconnection lines 565 (and 565'). Thus, if a predetermined test signal is input from the PCB 400 through the test signal input interconnection lines 131 (231) of the data driving chip package 100 (200), it passes through the test signal output pads 562 (562') connected (shorted) to the test signal input pads 561 (561') through the short-circuited interconnection lines 565 (565') and is then output back to the PCB 400 through the test signal output interconnection lines 132 (232).

After an anisotropic conductive film (ACF) 580 is attached to a plurality of pads 530, 540, 550, 561, and 562 formed on the first substrate 510, the data driving chip packages 100 (200) and the gate driving chip packages 300 are aligned and then attached to the display panel 500 (510) through thermo-compression. The test interconnection lines 130 (230) of the data driving chip package 100 (200) is bonded to the test signal input pads 561 and the test signal output pads 562 formed on the first substrate 510.

Although a test interconnection line pattern is formed on a data driving chip package in this example, a test interconnection line pattern may also be formed on a gate driving chip package where the gate driving chip package electrically connects a PCB and the display panel.

Hereinafter, a method for testing a driving chip package will be described in detail with reference to FIGS. 5A, 5B, and 6, and Table 1.

Figure 5A:
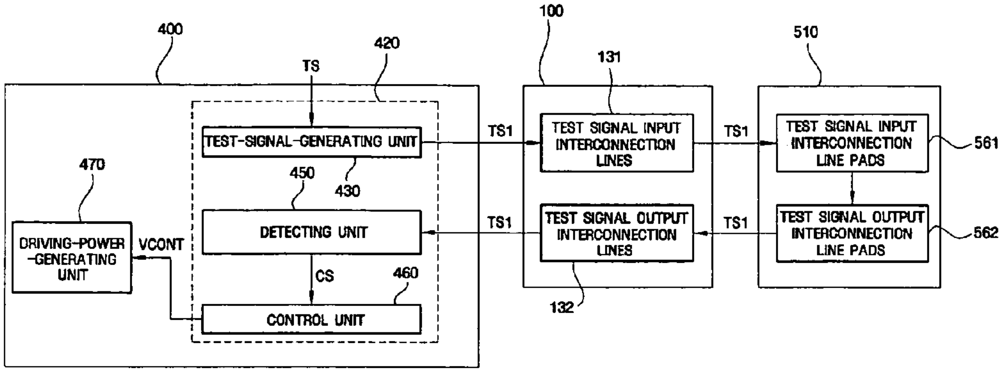
FIG. 5A is a block diagram of a testing unit 420 on a PCB and of a test circuit configuration for testing a driving chip package according to an embodiment of the present invention.

FIG. 5A is a block diagram of a testing unit 420 on a PCB and of a test circuit configuration for testing a driving chip package according to an embodiment of the present invention. For convenience of explanation, a single driving chip package attached to the peripheral edge of the display panel 500 in the display panel assembly 600 of FIG. 3 will be taken as a representative example.

Referring to FIG. 5A, the data driving chip package 100 includes the test signal input interconnection lines 131 and the test signal output interconnection lines 132. Meanwhile, the first substrate 510 of the display panel 500 includes the test signal input pads 561 and the test signal output pads 562 (shorted together).

The PCB 400 includes a driving power generating unit 470 and a testing unit 420. The driving power generating unit 470 of the PCB 400 generates predetermined driving signals for driving the display device. The driving signals include, without being limited to, a gate-ON voltage, a gate-OFF voltage, and a common voltage.

The testing unit 420 (operating in conjunction with the test interconnection lines 130, including test signal input interconnection line 131 and test signal output interconnection line 132) checks for and detects any contact failure of the data driving chip package 100 bonded to the first substrate 510. The testing unit 420 includes a test signal generating unit 430 (configured to receive a predetermined signal TS from an external device (not shown) and to generate a test signal TS1), a detecting unit 450 (configured to check, compare, that the test signal TS1 output from the test signal output interconnection lines 132 of the data driving chip package 100 is detected and generate a predetermined control signal CS based thereon), and a control unit 460 (configured to operate according to the control signal CS provided from the detecting unit 450 and to generate a power OFF signal VCONT for controlling the driving power generating unit 470).

The PCB 400 including the testing unit 420 operates in the following manner.

First, the testing unit 420 receives the signal TS from the external device, to initiate a test. The signal TS is input to the test signal generating unit 430 of the testing unit 420 to generate the test signal TS1 for transmitting across and back through the test interconnection lines 130 (lines 131, 132), for testing the data driving chip package 100. Here, the signal TS may be any one of the driving signals provided from the external device to the PCB 400 and the driving signal (e.g., buffered by the test signal generating unit 430) may be used as the test signal TS1. Alternatively, the test signal generating unit 430 of the testing unit 420 may be omitted, and any one of the driving signals provided from the external device to the PCB 400 may be provided as the test signal TS1 of the data driving chip package 100.

The test signal input interconnection lines 131 of the data driving chip package 100 receive the test signal TS1 from the testing unit 420. Since the data driving chip package 100 is bonded with the display panel 500, the test signal TS1 transmitted through the test signal input interconnection lines 131 is provided to the test signal input interconnection line pads 561 on the first substrate 510. The test signal input pads 561 on the first substrate 510 are electrically connected (e.g., shorted) with the test signal output pads 562 through the short-circuited interconnection lines 565 formed on the first substrate 510. Thus, the test signal TS1 provided to the test signal input pads 561 on the first substrate 510 is conducted to the test signal output interconnection lines 132 of the data driving chip package 100 through the test signal output pads 562 on the first substrate 510.

In other words, the test signal TS1 transmitted from the testing unit 420 of the PCB 400 is received by the detecting unit 450 of the testing unit 420 through the test signal input interconnection lines 131, the test signal input pads 561, the test signal output pads 562, and the test signal output interconnection lines 132.

The detecting unit 450 checks (compares) that the test signal TS1 output from the test signal output interconnection lines 132 is detected and generates the control signal CS accordingly. If the test signal TS1 is not detected through the test signal output interconnection lines 132, the detecting unit 450 generates the active control signal CS. The generated control signal CS is input to the control unit 460.

If the test signal TS1 is detected through the test signal output interconnection lines 132, the detecting unit 450 does not generate the active control signal CS.

When the control unit 460 receives the active control signal CS from the detecting unit 450 (indicating that the test signal TS1 is not detected through the test signal output interconnection lines 132), it generates the power OFF signal VCONT for controlling the driving power generating unit 470 of the PCB 400. The control unit 460 may include, but is not limited to, a switching device, such as a transistor (see FIG. 6).

Figure 5B:
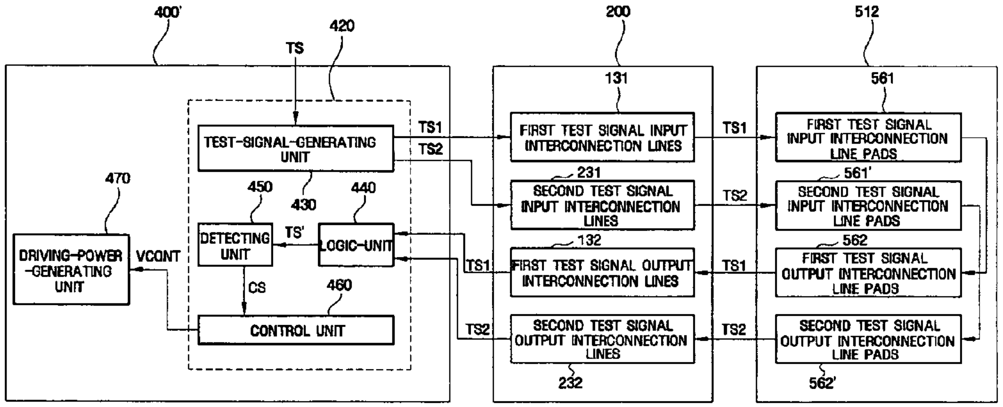
FIG. 5B a block diagram of a testing unit 420 on a PCB and of a test circuit configuration for testing a driving chip package according to another embodiment of the present invention.

FIG. 5B a block diagram of a testing unit 420 on a PCB and of a test circuit configuration for testing a driving chip package according to another embodiment of the present invention. For convenience of explanation, a single driving chip package attached to a peripheral edge of the display panel 500 in the display panel assembly of FIG. 4 will be taken as a representative example.

Referring to FIG. 5B, the testing unit 420 (on the A PCB 400') and the first and second test signal input interconnection lines 131 and 231 and the first and second test signal output interconnection lines 132 and 232 (on the data driving chip package 200, see FIG. 2), and the first and second test signal input pads 561 and 561' and the first and second test signal output pads 562 and 562' (on the first substrate 510 of the display panel 500) are electrically connected. The PCB 400' includes the driving power generating unit 470 and the testing unit 420.

The testing unit 420 checks (e.g., detects, determines) whether a contact failure exists between the data driving chip package 200 bonded to the first substrate 510. The testing unit 420 includes the test signal generating unit 430 that receives the signal TS from the external device and generates test signals TS1 and TS2. The testing unit 420 further includes a logic operation unit 440 that logically combines the test signals TS1 and TS2 output through the first and second test signal output interconnection lines 132 and 232 of the data driving chip package 100 and outputs a single test signal TS'. The testing unit 420 further includes the detecting unit 450 that receives the test signal TS' output from the logic operation unit 440 and generates the control signal CS based on the received test signal TS', and the control unit 460 that operates according to the control signal CS provided from the detecting unit 450 (e.g., generates the power OFF signal VCONT for controlling the driving power generating unit 470).

The testing unit 420 on the PCB 400' operates in the following manner.

The testing unit 420 receives the signal TS from an external device. The signal TS is input to the test signal generating unit 430 of the testing unit 420 which generates a plurality of test signals TS1 and TS2 for testing the data driving chip package 200. The signal TS may be any one of driving signals provided from the external device to the PCB 400'.

The first and second test signal input interconnection lines 131 and 231 of the data driving chip package 200 receive the test signals TS1 and TS2. The data driving chip package 200 is bonded to the display panel 500 and the test signals TS1 and TS2 input through the first and second test signal input interconnection lines 131 and 231 are provided to the first and second test signal input pads 561 and 561' on the first substrate 510. At this time, the first and second test signal input pads 561 and 561' are electrically connected with (shorted to) the first and second test signal output pads 562 and 562' through the short-circuited interconnection lines 565 and 565' formed on the first substrate 510. The test signals TS1 and TS2 provided to the first and second test signal input pads 561 and 561' on the first substrate 510 are provided to the first and second test signal output interconnection lines 132 and 232 through the first and second test signal output pads 562 and 562' on the first substrate 510.

The logic operation unit 440 logically combines the test signals TS1 and TS2 output from the first and second test signal output interconnection lines 132 and 232 and outputs the single test signal TS'. The logic operation unit 440 may be, for example, an AND-gate circuit, or a NAND-gate circuit, etc.

The detecting unit 450 determines whether the test signal TS' output from the logic operation unit 440 is detected and generates the control signal CS. If the test signal TS' is not detected, the detecting unit 450 generates the active control signal CS. The generated active control signal CS is input to the control unit 460.

If the test signal TS' is detected, the detecting unit 450 does not generate the active control signal CS.

If the control unit 460 receives the active control signal CS from the detecting unit 450, it generates the power OFF signal VCONT for controlling the driving power generating unit 470 of the PCB 400'. The control unit 460 may be or include, but is not limited to, a switching device.

A circuit used as the control unit 460 in FIGS. 5A and 5B will be described in detail with reference to FIG. 6 and Table 1.

Figure 6:
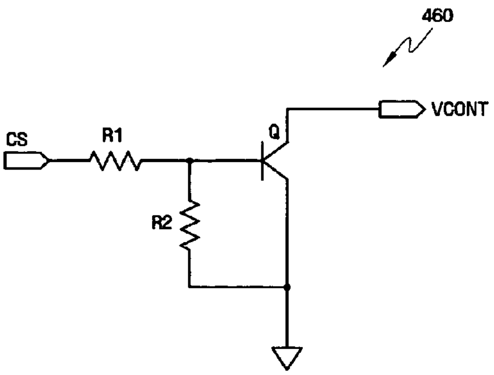
FIG. 6 is a circuit diagram of a circuit used in a control unit 460 of the testing unit 400 (or 400') shown in FIGS. 5A and 5B.

FIG. 6 is a circuit diagram of a circuit used as the control unit 460 in FIGS. 5A and 5B, and Table 1 shows the operation of the circuit of FIG. 6.

TABLE 1

| Type | TS1, TS2 | CS | Q | VCONT |
|---|---|---|---|---|
| Normal | 3.3 V | 3.3 V | Off | X |
| Abnormal | 3.3 V | 0 V | On | ○ |

Referring to FIG. 6 and Table 1, the control unit 460 may be a switch using a switching element Q and resistors R1 and R2.

The control unit 460 operates in the following manner.

The test signals TS1 and TS2 are provided to a data driving chip package from a testing unit having a high logic voltage (e.g., 3.3V), and upon receipt by the testing unit (through the data driving chip package and the display panel) they are input to a logic operation unit or a detecting unit.

Here, the detecting unit checks if the test signals TS1 and TS2 are detected and generates the control signal CS accordingly. In other words, if the test signals TS1 and TS2 passing through the data driving chip package and the display panel are not detected by the detecting unit, (e.g., they have 0V), the detecting unit generates and outputs the active control signal CS. If the test signals TS1 and TS2 passing through the data driving chip package and the display panel are detected by the detecting unit, (e.g., they have 3.3V), the detecting unit does not generate the active control signal CS.

The control signal CS is provided as an input to the control unit 460, i.e., an input to the switching element Q, and the switching element Q operates according to the input control signal CS. In other words, if the non-active control signal CS (e.g., at 3.3V) is input to the switching element Q, the switching element Q does not operate and thus, the control unit 460 does not generate the power OFF signal VCONT. If the active control signal CS of 0V is input to the switching element Q, i.e., the control signal CS is input to the switching element Q, the switching element Q operates and thus, the control unit 460 generates the power OFF signal VCONT. The resistors R1 and R2 for controlling turn-ON and turn-OFF voltage points are connected to an input terminal of the switching element Q of FIG. 6 and the turn-ON and turn-OFF points can be controlled by adjusting the ratio of resistances of the resistors R1 and R2.

The generated power OFF signal VCONT is input to the driving power generating unit to control the driving power generating unit. In other words, the power OFF signal VCONT is input to the driving power generating unit to shut down the driving power generating unit, in the case of a contact failure between the data driving chip package and the display panel.

Figure 7:
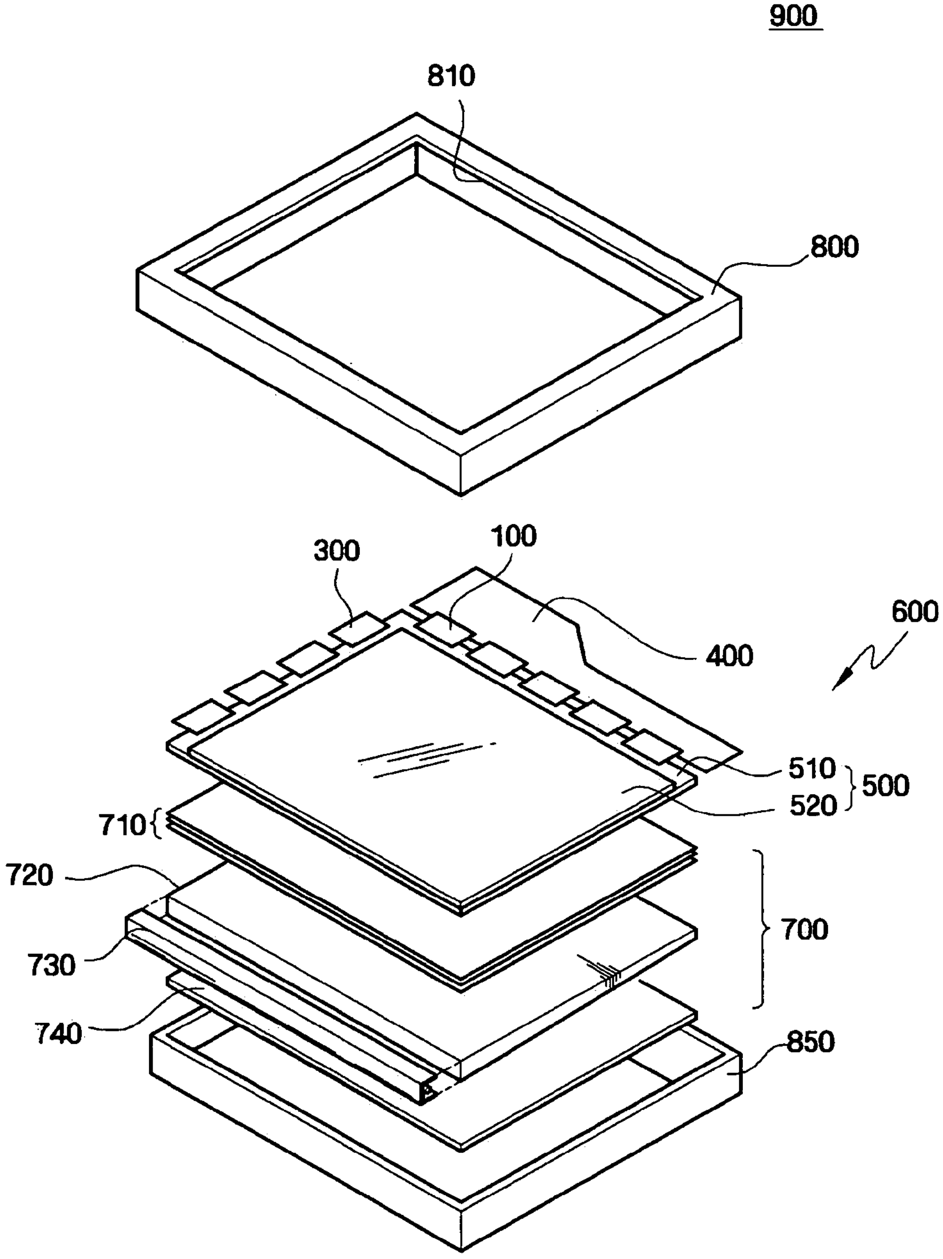
FIG. 7 is an exploded perspective view of a display device including the display panel assembly as shown in FIG. 3 or 4.

FIG. 7 is an exploded perspective view of a display device including a display panel assembly as shown in FIG. 3 or 4. For convenience the display panel 600 including the display panel assembly as shown in FIG. 3 is taken as an representative example.

Referring to FIG. 7, a display device 900 according to an embodiment of the present invention includes the display panel assembly 600, a backlight assembly 700, an upper container 800, and a lower container 850. The backlight assembly 700 includes optical sheets 710, a light guide plate 720, a lamp assembly 730, and a reflecting plate 740.

The light guide plate 720 guides light provided to the display panel assembly 600. The light guide plate 720 is made of a transparent panel made of a plastic such as acryl and guides light generated from the lamp assembly 730 to the display panel assembly 600 placed over the light guide plate 720. Various patterns (e.g., fine dot patterns) for affecting the traveling direction of light incident into the light guide plate 720 are printed at the back of the light guide plate 720.

The lamp assembly 730 is inserted into a side of the light guide plate 720 and includes a lamp that emits light and a lamp reflecting plate that surrounds the lamp. Although a single lamp is installed at a side of the light guide plate 720 in the small display device 900, a plurality of lamps may be installed in the single lamp assembly 730 to obtain sufficiently high luminance as the size of the display device 900 increases.

The reflecting plate 740 is installed under the light guide plate 720 and reflects light emitted under the light guide plate 720 onto the light guide plate 720. The reflecting plate 740 is positioned under the light guide plate 720 and reflects light that is not reflected to the projection surface of the light guide plate 720 through fine dot patterns at the back of the light guide plate 720, thereby reducing loss of light incident into the display panel and improving uniformity of light penetrating the projection surface of the light guide plate 720.

The optical sheets 710 are installed on the light guide plate 720 to diffuse and collect light transmitted from the light guide plate 720. The optical sheets 710 include a diffusion sheet, a prism sheet, and a protection sheet. Here, the diffusion sheet between the light guide plate 720 and the prism sheet diffuses light incident from the light guide plate 720, thereby preventing light from being concentrated. The prism sheet is formed in such a way that triangular prisms are arranged in a predetermined pattern on the top surface of the prism sheet. The prism sheet is generally composed of two sheets and prisms on the two sheets are arranged to cross each other at a predetermined angle to collect light diffused by the diffusion sheet in perpendicular to the display panel. Thus, light passing through the prism sheet travels perpendicularly, thereby obtaining uniform luminance distribution on the protection sheet. The protection sheet is formed on the prism sheet to protect the surface of the prism sheet and diffuses light for uniform light distribution.

The display panel assembly 600 is installed on the protection sheet and the display panel assembly 600 and the backlight assembly 700 are placed within the lower container 850.

The lower container 850 is square-shaped and has sidewalls along its upper peripheral surface to receive and fix the backlight assembly 700 and the display panel assembly 600 within the sidewalls and prevent the backlight assembly 700 including a plurality of sheets from being bent. The PCB 400 of the display panel assembly 600 is bent along the outer periphery of the lower container 850 and is placed on the back of the lower container 850. Here, the shape of the lower container 850 may vary according to a method for accommodating the backlight assembly 700 or the display panel assembly 600 within the lower container 850.

The upper container 800 is coupled with the lower container 850 to cover the top of the display panel assembly 600 accommodated in the lower container 850. A window 810 exposing the display panel assembly 600 is formed on top of the upper container 800.

The upper container 800 and the lower container 850 may be combined (securely connected) through hooks (not shown). For example, plastic hooks are formed along the outer periphery of the side walls of the lower container 850 and hook inserting recesses (e.g., holes, not shown) corresponding to the hooks may be formed at the sidewalls of the upper container 800. The hooks of the lower container 850 are inserted into the hook inserting recesses of the upper container 800, and thus the upper container 800 and the lower container 850 are interlockedly engaged. The engagement between the upper container 800 and the lower container 850 may have various shapes.

While the display device according to an embodiment of the present invention that has been described above is implemented in an edge-type backlight assembly by way of example, the invention is not limited thereto and can also be implemented in a display device using a direct-type backlight assembly or like display devices using the above-described display panel assembly.

As described above, any contact failures in a driving chip package can be easily detected to reduce additional quality management costs. Easy detection of contact failures in a driving chip package makes it possible to prevent further occurrence of contact failures and to increase the manufacturing yield.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, it is to be understood that the above-described exemplary embodiments have been provided only in a descriptive sense and will not be construed as placing any limitation on the scope of the invention.

What is claimed is:

1. A driving chip package comprising:

a base film made of an insulating material;

a plurality of interconnection lines formed on the base film, the interconnection line including input interconnection lines that conduct externally processed driving signals to a driving chip and output interconnection lines that output the driving signals processed in the driving chip; and a plurality of test signal interconnection lines formed on the base film parallel to the plurality of interconnection lines, the test signal interconnection lines not being connected to the driving chip and having a test signal input interconnection line and a test signal output interconnection line.

2. The driving chip package of claim 1, wherein the driving chip is configured to receive the driving signals from the input interconnection lines and processes the received driving signals to output the processed signals to the output interconnection lines, the driving chip is mounted on inner leads formed on a chip mounting area of the base film, each of the inner leads is connected to a corresponding one of the outer leads formed at a terminal portion of the base film through one of the input or output interconnection lines, and the test interconnection lines are formed between a pair of outer leads.

3. The driving chip package of claim 1, wherein the test interconnection lines are formed adjacent to and along the interconnection lines.

4. The driving chip package of claim 1, wherein two of the test interconnection lines are formed on opposite sides of the base film.

5. A display device comprising:

a display panel including a substrate and a pixel array for displaying an image;

a printed circuit board (PCB) configured to generate driving signals and control signals that drive and control the display panel; and a plurality of driving chip packages electrically connected to the display panel and to the PCB, wherein each of the plurality of driving chip packages includes:

a base film made of an insulating material;

a plurality of interconnection lines formed on the base film, the interconnection lines including input interconnection lines that conduct externally processed driving signals to a driving chip and output interconnection lines that output the driving signals processed in the driving chip; and a plurality of test signal interconnection lines formed on the base film parallel to the plurality of interconnection lines, the test signal interconnection lines are not connected to the driving chip and having a test signal input interconnection line and a test signal output interconnection line, wherein the display panel comprises a plurality of test signal pad formed on the display panel and the test signal pads are electrically connected through a short-circuited interconnection line.

6. The display device of claim 5, wherein the test signal interconnection lines includes a test signal input interconnection line configured to receive a predetermined test signal from the PCB, and a test signal output interconnection line configured to output to the PCB the predetermined test signal conducted through the short-circuited interconnection line from the test signal input interconnection line.

7. The display device of claim 5, wherein the PCB includes:

a driving power generating unit configured to generate a driving power of the display panel; and a testing unit electrically connected to the test signal interconnection lines formed on the base film of each driving chip package and configured detect a contact failure at a contact portion between the display panel and the driving chip package.

8. The display device of claim 7, wherein the testing unit includes:

a test signal generating unit configured to generate the predetermined test signal and to output the generated test signal to a test signal input interconnection line among the test signal interconnection lines;

a detecting unit configured to detect the predetermined test signal output from the test signal output interconnection line and to generate a control signal; and a control unit receiving the predetermined control signal from the detecting unit and generating a power OFF signal.

9. The display device of claim 8, wherein if the predetermined test signal output from the test signal output interconnection line is not detected, the detecting unit generates the active control signal, and if the predetermined test signal is detected, the detecting unit does not generate the control signal.

10. The display device of claim 8, wherein the power OFF signal controls the operation of the driving power generating unit.

11. The display device of claim 8, wherein the PCB includes:

a driving power generating unit configured to generate a driving power of the display panel; and a testing unit electrically connected to the test signal interconnection lines formed on the base film of each driving chip package and configured detect a contact failure at a contact portion between the display panel and the driving chip package.

12. The display device of claim 11, wherein the logic operation unit is an AND-gate.

13. The display device of claim 5, wherein the driving chip is configured to receive the driving signals from the input interconnection lines and processes the received driving signals to output the processed signals to the output interconnection lines, the driving chip is mounted on inner leads formed on a chip mounting area of the base film, each of the inner leads is connected to a corresponding one of the outer leads formed at a terminal portion of the base film through one of the input or output interconnection lines, and the test interconnection lines are formed between a pair of outer leads.

14. The display device of claim 5, wherein the test interconnection lines are formed adjacent to and along the interconnection lines

15. The display device of claim 5, wherein two of the test interconnection lines are formed on opposite sides of the base film.

* * * * *